United States Patent
Aoki et al.

(10) Patent No.: US 9,627,177 B2
(45) Date of Patent: Apr. 18, 2017

(54) MASS SPECTROMETER AND MASS IMAGE ANALYZING SYSTEM

(71) Applicant: CANON KABUSHIKI KAISHA, Tokyo (JP)

(72) Inventors: Naofumi Aoki, Nagoya (JP); Masafumi Kyogaku, Yokohama (JP); Kota Iwasaki, Atsugi (JP); Yohei Murayama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 6 days.

(21) Appl. No.: 14/414,072

(22) PCT Filed: Jun. 24, 2013

(86) PCT No.: PCT/JP2013/067954
§ 371 (c)(1),
(2) Date: Jan. 9, 2015

(87) PCT Pub. No.: WO2014/010443
PCT Pub. Date: Jan. 16, 2014

(65) Prior Publication Data
US 2015/0155132 A1 Jun. 4, 2015

(30) Foreign Application Priority Data
Jul. 12, 2012 (JP) .................. 2012-156631

(51) Int. Cl.
*H01J 49/00* (2006.01)
*H01J 37/26* (2006.01)
(Continued)

(52) U.S. Cl.
CPC ........ *H01J 37/261* (2013.01); *H01J 49/0004* (2013.01); *H01J 49/142* (2013.01);
(Continued)

(58) Field of Classification Search
CPC combination set(s) only.
See application file for complete search history.

(56) References Cited

U.S. PATENT DOCUMENTS

| 4,559,096 A | * | 12/1985 | Friedman | ............... H01J 37/31 156/253 |
| 6,414,307 B1 | * | 7/2002 | Gerlach | ............... G01N 23/225 250/307 |

(Continued)

FOREIGN PATENT DOCUMENTS

| CN | 101073137 A | 11/2007 |
| EP | 1185857 B1 | 9/2007 |

(Continued)

OTHER PUBLICATIONS

Piehowski, et al., "Freeze-Etching and Vapor Matrix Deposition for ToF-SIMS Imaging of Single Cells", Langmuir, 2008, pp. 7906-7911, vol. 24, No. 15.

*Primary Examiner* — Phillip A Johnston
*Assistant Examiner* — Hsien Tsai
(74) *Attorney, Agent, or Firm* — Canon USA Inc., IP Division

(57) ABSTRACT

To provide a mass spectrometer capable of performing high-sensitivity measurement using water molecules.
The mass spectrometer has a chamber in which a sample is disposed, an irradiation unit for emitting particles to the sample, and an extraction electrode which leads secondary ions emitted from the sample to a mass spectrometry unit, in which the irradiation unit switches a first mode of emitting primary ions for causing the secondary ions to be emitted from the sample and a second mode of emitting particles containing water molecules to be made to adhere to the sample and emits the particles to the sample.

19 Claims, 4 Drawing Sheets

(51) Int. Cl.
*H01J 49/14* (2006.01)
*H01J 49/04* (2006.01)

(52) U.S. Cl.
CPC ....... *H01J 49/0468* (2013.01); *H01J 2237/08* (2013.01); *H01J 2237/2448* (2013.01); *H01J 2237/2602* (2013.01)

(56) References Cited

U.S. PATENT DOCUMENTS

| | | | |
|---|---|---|---|
| 2005/0230635 A1 | 10/2005 | Takats et al. | |
| 2008/0277576 A1* | 11/2008 | Komatsu | H01J 49/142 250/287 |
| 2011/0266437 A1* | 11/2011 | Park | H01J 49/142 250/288 |
| 2013/0320204 A1* | 12/2013 | Komatsu | H01J 49/0468 250/282 |

FOREIGN PATENT DOCUMENTS

| | | |
|---|---|---|
| JP | 2003-504616 A | 2/2003 |
| JP | 2008-282726 A | 11/2008 |
| JP | 2009-187950 A | 8/2009 |
| JP | 2009-539093 A | 11/2009 |
| JP | 2011-029043 A | 2/2011 |
| JP | 2012-083138 A | 4/2012 |
| KR | 10-2011-0121999 A | 11/2011 |
| WO | 01/04611 A2 | 1/2001 |
| WO | 2007/145232 A1 | 12/2007 |

* cited by examiner

MASS SPECTROMETER AND MASS IMAGE ANALYZING SYSTEM

TECHNICAL FIELD

The present invention relates to a mass spectrometer using water molecules and to a mass image analyzing system using the mass spectrometer.

BACKGROUND ART

An analytical method is known which comprehensively visualizes the amount of protein developed in tumor tissues or the like based on the mass signal intensity using matrix-assisted laser desorption/ionization (MALDI) and secondary ion mass spectroscopy (SIMS).

In the measurement of a living body sample by MALDI or SIMS, the sample constituent components are detected in an ionized state. In particular, the sample constituent components are detected as proton added molecules in many cases. Therefore, in order to increase the sensitivity of the detection of the sample constituent components, it is effective to add proton to the sample constituent components. As a method for promoting addition of proton to the sample constituent components, a method using the moisture contained in the sample and a method for giving moisture thereto from the outside are known. NPL 1 discloses a method for causing moisture to be adsorbed to the sample by cooling the sample in a water atmosphere to generate proton added molecules.

In SIMS, the utilization of cluster ions as a primary ion beam source for ionizing the sample has been examined. Heretofore, ions (single atom ions) whose atom is ionized has been used for primary ions. By the use of cluster ions with a high mass, damages to the sample can be reduced and the detection of the sample constituent components having a larger molecular weight can be achieved as compared with the case of using single atom ions with a low mass. PTL 1 discloses a method for performing mass spectrometry, using gas cluster ions as the primary ion beam source.

CITATION LIST

Patent Literature

PTL 1 Japanese Patent Laid-Open No. 2011-29043

Non Patent Literature

NPL 1 Langmuir 2008, 24, P. 7906

There has been such a problem that when water or vapor is introduced into the mass spectrometer, the inside of the apparatus is exposed to a water vapor atmosphere, so that the apparatus is contaminated.

According to NPL 1, by setting a measurement chamber into a vacuum state, and then cooling a sample, water molecules remaining in the measurement chamber are caused to adhere to the sample. According to the method, it has been difficult to control the amount of water molecules in the measurement chamber and it has been difficult to control the amount of water molecules to be given to the sample surface. Therefore, when a large amount of water molecules are given, a reduction in the ion detection sensitivity has been caused, or when the amount of water molecules to be given is small, an increase in the ion detection sensitivity has not been sufficiently achieved in some cases.

The water cluster ions disclosed in PTL 1 sputter the sample to generate secondary ions. Therefore, the irradiation with the water cluster ions to the sample causes damages to the sample itself. Thus, the method has not been suitable as a method for giving, before measurement, water molecules to the sample for promoting ionization.

SUMMARY OF INVENTION

The invention provides a mass spectrometer which achieves high-sensitivity measurement using water molecules.

Moreover, the invention provides a mass spectrometer having an irradiation unit capable of irradiating a sample with both primary ions and particles for giving water molecules.

The mass spectrometer according to the invention is a mass spectrometer which irradiates a sample with primary ions to perform mass spectrometry of secondary ions emitted from the sample, and the mass spectrometer has a chamber in which the sample is disposed, an irradiation unit for irradiating the sample with particles, and an extraction electrode which leads the secondary ions emitted from the sample to a mass spectrometry unit, in which the irradiation unit switches a first mode of irradiation of the primary ions for causing the secondary ions to be emitted from the sample and a second mode of emitting particles containing water molecules to be made to adhere to the sample and emits the particles to the sample.

According to the invention, since both the particles containing water molecules to be given before measurement and the primary ions used for the measurement can be individually given to the sample by switching, a mass spectrometer which allows high-sensitivity measurement can be provided.

By the use of the water cluster ions as the primary ions, a path for the water molecules as the generation source to an introduction portion and a sample, a shielding or separating unit provided in the path, and the like can be used in common and the necessity of providing another introduction unit which may cause contamination, such as a vapor introduction valve, in the chamber is eliminated. This allows high-sensitivity measurement with a simple configuration.

Further features of the invention will become apparent from the following description of exemplary embodiments with reference to the attached drawings.

DESCRIPTION OF EMBODIMENTS

Figure 1A:
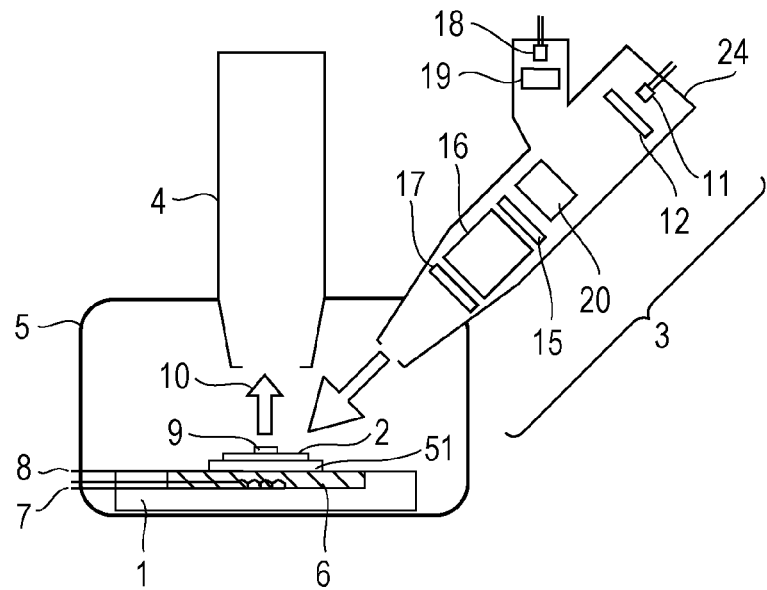
FIGS. 1A and 1B are schematic views illustrating the outline of an apparatus configuration according to an embodiment of the invention.
Figure 1B:
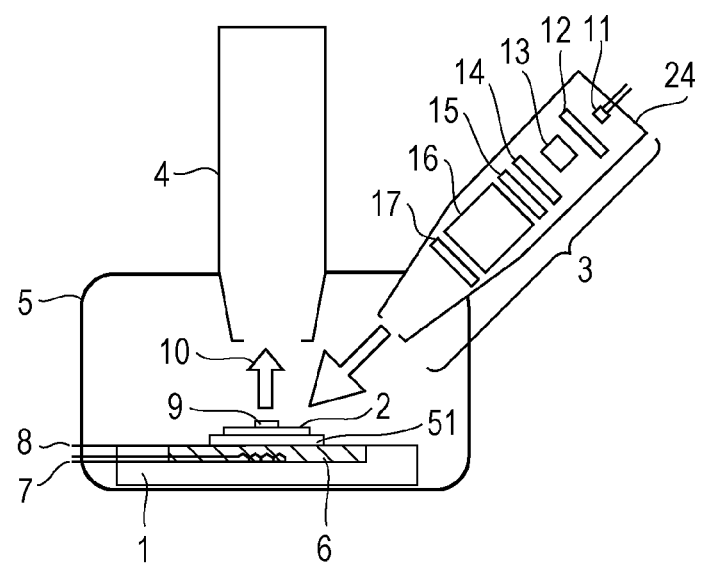

Hereinafter, a method of the invention and the configuration of an apparatus for use in the method of the invention are described with reference to FIGS. 1A and 1B. FIGS. 1A and 1B are schematic views illustrating the outline of the apparatus configuration for carrying out the method according to embodiments of the invention. The description is one embodiment of the invention, and the invention is not limited thereto.

In the invention, irradiation of primary ions and particles containing water molecules may form a beam or may not form a beam. The beam in the invention refers to the flow in which the particles move in the same direction while forming groups. However, this flow may show the average movement direction of the particle groups and the movement direction of all the particles are not required to be the completely same direction. On the other hand, when the beam is not formed, particle groups not having a certain flow are formed.

In the invention, when irradiation of the primary ions and the particles containing water molecules do not form a beam, but form particle groups, irradiation of the primary ions and the particles containing water molecules can be performed by scattering the particle groups near the sample surface. In the case where a beam is formed, the sample surface can be irradiated with the primary ions utilizing an electric field or the like, when the particles containing water molecules are ions, the sample surface can be irradiated with the particles utilizing an electric field or the like, or when the particles containing water molecules are nonionic particles, the sample surface can be irradiated with the particles utilizing a pressure difference or the like. From the viewpoint of controllability, it is suitable that the primary ions and the particles containing water molecules form a beam but the invention is not limited to the utilization of the beam. In the specification, in the case where both the beam and the particle group are acceptable, the "beam" is described.

The mass spectrometer of the invention allows mass distribution measurement as a two-dimensional mass distribution image of the sample surface. The mass spectrometer has a beam generating portion 3 as a beam irradiation unit for irradiating the surface of a sample 2 on a sample stage 1 with primary ions and particles by switching a first mode of irradiation of a primary ion beam and a second mode of emitting particles containing water molecules ($H_2O$) for causing the water molecules to adhere to the sample. The mass spectrometer further has a secondary ion detection portion 4 which is a mass spectrograph for detecting secondary ions generated from the sample.

Moreover, the mass spectrometer of the invention suitably has a sample cooling portion 6 capable of cooling the sample, a heating portion 7, such as an electrically heated wire heater, capable of heating the sample, and a temperature monitor 8, such as a thermocouple, near the sample 2. By the use of the sample cooling portion 6, the heating portion 7, and the temperature monitor 8, the temperature of the sample can be held at a certain temperature in the range of +40° C. to −160° C.

For the sample cooling portion 6, a mechanism of bringing a liquid nitrogen tank disposed at the outside of a measurement chamber 5 held in a vacuum and the sample cooling portion 6 into heat contact with each other can be used. The sample cooling portion 6 can also be constituted by a Peltier element or the like.

The sample 2 is a solid, and a high molecular weight compound, a low molecular weight compound, an organic compound, an inorganic compound, a living body, an internal organ, a living body-derived sample, a tissue section, a cell, a cultured cell, and the like can be mentioned as an example. As an example of a structure constituting the sample 2, an organic compound, an inorganic compound, protein, peptide, a sugar chain, polynucleotide, oligonucleotide, and the like can be mentioned.

A substrate 51 is disposed on the sample stage 1. The sample stage 1 has a moving mechanism in the horizontal direction and the vertical direction. By moving the sample stage 1 in the XYZ directions as desired, a desired region on the sample 2 can be set as a measurement target region. In addition thereto, the sample stage 1 has a tilting mechanism and can desirably change the incident angle of the primary ions and particles containing water molecules to the sample.

As the secondary ion detection portion 4, mass spectrometry methods, such as a time-of-flight type, a magnetic field deflection type, a quadrupole type, an ion trap type, and a Fourier transform ion cyclotron resonance type, can be employed. Moreover, scanning type and projection type imaging mass spectrometry methods can be employed.

When adopting the scanning type imaging mass spectrometry method, in order to increase the spatial resolution, it is necessary to converge the primary ion beam to the order of a desired spatial resolution. On the other hand, in the projection type imaging mass spectrometry method, since the spatial resolution is not dependent on the beam diameter, the beam diameter can be made larger than that in the scanning type. For example, the beam diameter of several tens of micrometers or more can be used. Therefore, it is suitable to adopt the projection type imaging mass spectrometry method. When the time-of-flight type mass spectrometry method is adopted as the secondary ion detection portion in the case of adopting the projection type imaging mass spectrometry method, the secondary ion generation position within the sample plane and the detection time of the secondary ions can be simultaneously recorded. Therefore, when adopting the projection type imaging mass spectrometry method, it is suitable to adopt the time-of-flight type mass spectrometry method.

The apparatus has the second mode of causing water molecules to adhere to the sample surface by irradiating the cooled sample 2 with particles containing water molecules with a speed or an energy lower than those of irradiation of the primary ions in the first mode. A water molecule film 9 can be formed on the sample surface by the second mode.

In the second mode, the irradiation unit emits the particles containing water molecules in such a manner that the particles adhere to the sample surface and the emitted particles may be nonionic particles or ionic particles.

Then, by irradiating the sample with a primary ion beam in the first mode, secondary ions 10 are emitted from the sample. By detecting the emitted secondary ions 10 by the secondary ion detection portion 4, mass spectrometry is performed.

The beam of particles containing water molecules and the primary ion beam are emitted from the same beam generating portion 3. More specifically, a function of generating the particles containing water molecules to be made to adhere to the sample and a function of generating the primary ion beam are switched for use.

When the beam of particles containing water molecules is used in order to give the water molecules, a desired amount of the water molecules can be given to a desired position of the sample by adjusting the irradiation range, the irradiation time, and the irradiation amount of the beam, so that such a possibility that the water molecules collide with a position other than the desired position in the apparatus can be reduced.

Therefore, by the use of the beam of particles containing water molecules, a mass spectrometer capable of performing high-sensitivity measurement in which the controllability when giving the water molecules is high and which can aim at reduction in contamination of the apparatus can be provided.

When the beam of particles containing water molecules is a beam of nonionic particles, the beam is not accelerated by various types of electrodes, so that the speed and the energy are lower than those of the ion beam. Therefore, by the use of the beam of nonionic particles containing water molecules, damages to the sample when giving the water molecules can be reduced.

On the other hand, when the beam of particles containing water molecules is a beam of ionic particles, the giving of the water molecules to the sample can be more highly controlled by various types of electrodes. In this case, by the use of a beam whose speed and energy are sufficiently lower than those of the primary ion beam, damages to the sample can be suppressed.

In some cases, ionic particles and nonionic particles are mixed in the beam. In the invention, however, since all the particles have lower energy and lower speed as compared with the primary ions and damages to the sample can be suppressed, the ionic particles and the nonionic particles may be mixed. In this specification, even in the case where the ionic particles and the nonionic particles are mixed in the beam, when using an ionic substance as the main raw materials of the beam or using a process of ionizing particles when forming a beam, the beam to be formed is indicated as ionic particles and, in other cases, the beam to be formed is indicated as nonionic particles.

Beam Irradiation Unit

As the configuration of the beam generating portion 3 which is a beam irradiation unit, various forms can be adopted as described in detail in each embodiment described later. The configuration at least contains a particle generating chamber 24 connectable to the measurement chamber 5 in which a sample is disposed as illustrated in FIGS. 1A and 1B and an introduction portion 11 or 18 of particles to be formed into a beam. For the particle generating chamber 24, in order to generate particles by emitting liquid or gas from the introduction portion, a pressure resistant chamber is used so that a pressure reduction and a pressure increase in the chamber are achieved.

Moreover, it is suitable that a gate is provided at a connection portion of the chambers in such a manner that the pressure in the particle generating chamber 24 can be adjusted independently from the pressure in the measurement chamber 5 and further an exhaust pump is connected to each of the chambers. Thus, unnecessary water molecules, for example, once adhering to the particle generating chamber can be exhausted and removed not via the measurement chamber. Moreover, in order to promote the evaporation of moisture adhering to the inside of the particle generating chamber, an evaporation promoting unit, such as a heating unit, may be provided.

The nonionic particles refer to particles which are not ionized against ionized ion particles, such as ionized single atoms or molecular ions, or polyatomic or polymolecular cluster ions. As the particles, single atoms or molecules or a cluster of polyatomic or polymolecular particles is mentioned.

Beam of Particles Containing Water Molecules to be Made to Adhere to the Sample

The beam of the particles containing water molecules to be made to adhere to the sample emitted from the beam generating portion 3 may be constituted by only a water monomer or only a water cluster or may be constituted by both the water monomer and the water cluster. A monomer or a cluster of Ar or the like and a water monomer or a water cluster may be mixed. Helium gas, nitrogen gas, or the like and a water monomer or a water cluster may be mixed. In water to be supplied to the beam generating portion, an organic solvent, such as alcohol, for example, ethanol or methanol may be compounded beforehand. In water to be supplied to the beam generating portion, acid, such as formic acid, acetic acid, and trifluoroacetic acid, may be compounded beforehand.

In order to increase the detection sensitivity to secondary ions, it is suitable that water molecules are given to the entire range of the secondary ion detection range. Therefore, the range of the water molecules to be given to the sample, i.e., the beam diameter of particles containing water molecules with which the sample is irradiated, is equal to or larger than the irradiation diameter of the primary ion beam. In the invention, "equal" refers to being 0.9 to 1.1 in terms of a diameter ratio.

Primary Ion Beam

The primary ion beam emitted from the beam generating portion 3 may be one capable of emitting secondary ions from the sample 2. The type of the primary ion is not particularly limited and, for example, liquid metal ions, such as $Bi^+$ or $Ga^+$, metal cluster ions, such as $Bi_3^+$ or $Au_3^+$, carbon cluster ions, such as $C60^+$, liquid cluster ions, such as water ($H_2O$), gas cluster ions, such as Ar, and the like can be used. Since the cluster ion has an effect of reducing damages, the cluster ion is effective for a living body sample.

Giving of Water Molecules

In order to give water molecules to the sample surface, the inside of the measurement chamber 5 is first evacuated. Then, the sample is held at a temperature at which water or an aqueous solution to be introduced can be present as a solid or liquid. The temperature is dependent on the pressure of the vacuum chamber and can be determined from the vapor pressure curve of the water or the aqueous solution to be introduced. Then, the sample is irradiated with the beam of nonionic particles containing water molecules. In this case, the amount of the water molecules to be given to the sample surface can be adjusted by adjusting the irradiation amount of the beam of nonionic particles containing water molecules and the sample temperature.

By scanning the stage, water molecules can be given to a plurality of portions. The area and the form of the water molecules to be given to the sample surface vary depending on the irradiation beam diameter of nonionic particles containing water molecules and the number of irradiation spots.

The water molecules 9 formed by the method described above are controlled to have an adhesion amount and a form which allow the primary ion beam to reach the surface of the sample 2 and do not block the elimination of the constituent components of the sample 2.

The water molecules to be given to the sample surface can have a form in which the water molecules are discretely distributed or a form in which the water molecules form a continuous film shape. As the form in which the water molecules are discretely distributed, a dot shape, an island shape, or a discontinuous film shape in which discrete island shapes are partially connected can be employed. These forms can also be considered as one form of a discontinuous film. A case where the given water molecules form a continuous film shape, a case where the film thickness is uniform, or a non-uniform film with a non-uniform film thickness can be employed. When it is considered that the given water molecules form a film-like shape, the average film thickness can be converted from the mass using the density of ice. When the density of ice is 0.93 g/cm$^3$, the average amount of the given water molecules of 10 ng/mm$^2$ is equivalent to the average film thickness of 11 nm.

Method for Controlling Amount of Water Molecules to be Given to Sample Surface

As a method for controlling the amount of the water molecules 9 to be given to the surface of the sample 2, a method including disposing a crystal oscillator sensor (QCM: Quarts Crystal Microbalance) on, for example, a position of the sample, and then investigating the relationship between the irradiation amount of the beam of nonionic particles containing water molecules and the amount of the water molecules to be given to the sample beforehand is mentioned as an example of the controlling method. Or, a method including calculating the adhesion amount of the water molecules by calculating the number of the introduced water molecules or the number of the water molecules which collide with the sample, and then controlling the water molecule amount in such a manner that an appropriate amount of the water molecules is given is mentioned as an example of the controlling method. When the area in which the water molecules 9 are given is sufficiently large, the water molecule adhesion amount is measured using the reflectance change of infrared light or visible light, and then controlling the water molecule amount in such a manner that an appropriate amount of the water molecules is given is mentioned as an example of the controlling method.

The amount of the water molecules 9 may be changed according to the configuration of the mass spectrometer or the type of the sample to be used. As a method for finding the optimal amount of the water molecules to be given for the configuration of the mass spectrometer or the type of the sample to be used, a method including preparing a sample to which an excessive amount of water molecules are once given beforehand, and then increasing the temperature of the substrate 51 while measuring the sample in the measurement chamber 5 to gradually reduce the adhesion amount of the water molecules 9 is mentioned as an example of the method. The signal intensity of water molecule-derived ions obtained from some samples 2 different in amount of the water molecules 9 ($H_2O^+$, $[H_2O+H]^+$, and the like) and sample constituent component ions is measured by mass spectrometry, and then a signal intensity correlation table of the signal intensity of $H_3O^+$ and the sample constituent component ions is created. By the correlation table, the value of the signal intensity of the water molecule-derived ions corresponding to a suitable adhesion amount of the water molecules 9 can be found.

When performing mass spectrometry of the same type of the sample 2 with the configuration of the same apparatus after creating the above-described signal intensity correlation table having signal intensity correlation information, the amount of the water molecules 9 is adjusted with reference to the correlation table in such a manner that the signal intensity of the water molecule-derived ions ($H_2O^+$, $[H_2O+H]^+$, and the like) may become the optimal value. Specifically, when the amount of the water molecules 9 is large, the temperature of the substrate 51 is increased to reduce the water molecules 9 and when the amount of the water molecules 9 is small, the process of giving water molecule is repeated. By measuring the constituent components of the sample 2 after adjusting the amount of the water molecules 9 to the optimal amount, measurement with high reproducibility can be repeatedly performed in the optimal state.

Mass Spectrometry of Constituent Components

After giving the water molecules 9, the sample 2 is irradiated with the primary ion beam while holding the temperature of the sample 2 to thereby perform mass spectrometry. The proton addition to the sample constituent components is promoted by the action of the water molecules 9 given to the surface, so that the constituent components of the sample 2 can be detected with high sensitivity. When a solution component adheres in the state of a solid (ice), the outflow of water-soluble components of the sample 2 can be suppressed, so that detection holding the inherent distribution information of the constituent components of the sample 2 can be achieved. Furthermore, by holding the sample temperature to be equal to or lower than the evaporation temperature of water or ice also during the mass spectrometry with reference to the vapor pressure curve diagram of water or ice and holding the vacuum state and the temperature at which the adhesion of the water molecules remaining in a vacuum can be suppressed, the adhesion amount of the water molecules can be uniformly held at a certain amount over a long period of time and long-term and stable detection can be achieved.

Change in Constituent Component Detection Intensity Depending on Water Molecule Adhesion Amount Next, the amount of the water molecules given to the sample surface and the ion detection intensity of the sample constituent components are described with reference to FIGS. 2A and 2B.

For the sample, human-derived peptide molecules "Angiotensin II (Mw: 1046)" were used. First, a solution in which the sample was dissolved in ion exchanged water at $10^{-6}$M was prepared. Next, an ink jet print dot pattern of the Angiotensin II was formed using the solution on a silicon wafer with an ink jet discharge unit. The size of one dot thus formed is about 100 μm in diameter and about 30 fmol of the Angiotensin II molecules is present in each dot. By measuring the dots, the detection intensity can be compared.

In order to investigate the change in the detection intensity of the sample constituent components based on the water molecule adhesion amount, a dot pattern sample of the Angiotensin II in which the water molecule adhesion amount was changed was prepared. By performing mass spectrometry of each dot thereof under the same conditions as described above, a signal intensity correlation table of the peak area intensity of [Angiotensin II+H]$^+$ in the obtained mass spectrum and the peak area intensity of the water molecule-derived ions [$H_3O$]$^+$ is shown in FIG. 2A and the relationship between the peak area intensity of [Angiotensin II+H]$^+$ in the obtained mass spectrum and the given amount of the water molecules measured using a crystal oscillator sensor is shown in FIG. 2B. The signal intensity of the water molecule-derived ions [$H_3O$]$^+$ in FIG. 2A correlates with the water molecule adhesion amount. By the correlation table, the value of the signal intensity of the water molecule-derived ions corresponding to a suitable water molecule adhesion amount can be found. Moreover, as is understood from FIG. 2B, a state is understood in which the detection intensity of the sample constituent components changes when changing the water molecule adhesion amount.

In order to increase the ion detection sensitivity by giving water molecules, it is suitable that the amount of the water molecules 9 to be given to the sample is 20 ng (20 ng/mm$^2$) or lower and suitably 0.1 ng/mm$^2$ or more and 20 ng/mm$^2$ or lower per mm$^2$ of the sample surface. Or, it can be said that a suitable average film thickness of the water molecules 9 is 22 nm or lower or in the range of 0.11 nm or more and 21.5 nm or lower. Therefore, supposing that all the water molecules with which the sample is irradiated adhere to the sample and the density of ice is 0.93 g/cm$^3$, the number of the water molecules with which the sample is irradiated may be adjusted to $3.3 \times 10^{12}$ molecules/mm² or more and $6.7 \times 10^{14}$ molecules/cm² or lower.

Next, embodiments of the invention are described in detail.

First Embodiment

The beam generating portion 3 of a first embodiment according to the invention is described with reference to FIG. 1A. Since the configuration other than the beam generating portion is the same as that described above, the description is omitted.

First, a method for generating a beam of nonionic particles containing water molecules is described.

Vapor generated by babbling pure water or an aqueous solution with $N_2$, He, or the like is jetted into in the beam generating portion 3 from the first introduction portion 11, such as a nozzle, at a pressure of about 0.1 MPa to 1 MPa. Alternatively, pure water or an aqueous solution can be jetted from the first introduction portion 11 by applying pressure thereto.

In this case, the jetted vapor can also be formed into a water cluster utilizing the cooling effect caused by adiabatic expansion.

Part of the jetted vapor passes through a beam forming portion 12 constituted by a shielding or separating unit, such as a skimmer, a beam of nonionic particles containing water molecules is formed.

By irradiating the cooled sample with the generated beam of nonionic particles containing water molecules, the water molecules can be given thereto.

Next, a method for generating a primary ion beam is described.

When using liquid metal ions, such as $Bi^+$ or $Ga^+$, metal cluster ions, such as $Bi_3^+$ or $Au_3^+$, or carbon cluster ions, such as $C60^+$, for the primary ion beam, ion source materials, such as Bi, Ga, Au, and C60, are introduced from a second introduction portion 18. Then, the materials are ionized by an ion beam forming portion 19, and then led to a third deflecting electrode 20. For the ion beam forming portion 19, the mechanism used for a general ion gun can be used and, for example, is constituted by an extraction electrode, a deflecting electrode, an aperture, a filter electrode, a mass separator, or the like. In the third deflecting electrode, the orbit of the primary ion beam is deflected toward a sample.

When using liquid cluster ions, such as water ($H_2O$) or gas cluster ions, such as Ar, as the primary ion beam, the gas is jetted into the beam generating portion 3 from the second introduction portion 18, such as a nozzle, at a pressure of about 0.1 MPa to 1 MPa.

When using water cluster ions for the primary ion beam, water or vapor generated by babbling pure water or an aqueous solution with $N_2$, He, or the like is jetted into the beam generating portion 3 from the second introduction portion 18, such as a nozzle, at a pressure of about 0.1 MPa to 1 MPa. Or, pure water or an aqueous solution can be jetted from the first introduction portion 11 by applying pressure thereto.

The jetted gas can be formed into a cluster using the cooling effect caused by adiabatic expansion.

The generated cluster is ionized by the ion beam forming portion 19, and then led to the third deflecting electrode 20. In this case, the ion beam forming portion is formed by a beam forming portion constituted by a skimmer or the like, an ionization chamber, and an extraction electrode. The cluster passes through the beam forming portion constituting the ion beam forming portion 19, and is ionized in the ionization chamber. As the ionization method, an electron impact method or the like can be used. When using liquid cluster ions, such as water ($H_2O$), as the primary ion beam, an electrospray method can also be used as the ionization method. In this case, since a high voltage is applied to a nozzle used for cluster generation, the ionization chamber is not necessarily provided separately.

The generated cluster ions are accelerated toward the third deflecting electrode 20 by the extraction electrode to which an energy of several keV is applied.

The primary ion beam generated as described above is deflected with the third deflecting electrode 20, and then led toward the sample.

The primary ion beam contains single atom ions or cluster ions different in size in some cases. When using cluster ions with a large mass, damages to the sample can be reduced and the detection of the sample constituent components having a larger molecular weight can be achieved. Therefore, it is suitable to sort the primary ion size.

When sorting the primary ion size, a primary ion size sorting portion 16 is disposed in the beam generating portion 3. In the primary ion size sorting portion 16, a mass separator, such as a time-of-flight type, a magnetic field deflection type, a quadrupole type, an ion trap type, or a Fourier transform ion cyclotron resonance type, can be disposed.

For example, when sorting the cluster size using the time-of-flight type mass separator, the water cluster ion beam accelerated by an extraction electrode 14 is first subjected to pulse shortening by performing chopping by the first deflecting electrode 15. Next, by giving an appropriate delay time (time-of-flight), and then performing chopping again by the second deflecting electrode 17, primary ions of a specific size are sorted out.

A magnetic field deflection type mass sorting function may be imparted to the third deflecting electrode 20.

The primary ion size sorting portion 16, the first deflecting electrode 15, and the second deflecting electrode 17 may be mounted in the beam forming portion 19 or may be disposed between the beam forming portion 19 and the third deflecting electrode 20.

The primary ions thus sorted out are emitted from the beam generating portion 3, and then the sample 2 to which the water molecules 9 are given can be irradiated with the primary ions.

In order to adjust the beam diameter and the beam orbit, it is suitable to dispose one or more beam converging electrodes in the beam generating portion 3.

According to this embodiment, both the beam of nonionic particles for giving water molecules and the primary ion beam can be emitted from the same beam generating portion.

When the beam of nonionic particles containing water molecules for giving water molecules is used, a desirable amount of the water molecules can be given to a desirable position of the sample by adjusting the irradiation range, the irradiation time, and the irradiation amount of the beam, and such a possibility that the water molecules collide with a position other than the desired position in the apparatus can be reduced. Therefore, by the use of the beam of nonionic particles containing water molecules, a mass spectrometer capable of performing high-sensitivity measurement can be provided in which the controllability when giving water molecules is high and reduction of apparatus contamination can be achieved.

Since the beam of nonionic particles containing water molecules is not accelerated by various types of electrodes, the speed is lower and the energy is smaller as compared with the primary ion beam. Therefore, the use of the beam of nonionic particles containing water molecules can reduce damages to the sample when giving the water molecules.

Second Embodiment

In a second embodiment according to the invention, the beam of nonionic particles containing water molecules and the primary ion beam are introduced into the beam generating portion 3 through the first introduction portion 11 used in common.

The beam generating portion 3 is described with reference to FIG. 1B. Since the configuration other than the beam generating portion 3 is the same as that of the first embodiment, the description thereof is omitted.

The beam of nonionic particles containing water molecules is generated by the same method as that of the first embodiment. As described above, the beam of nonionic particles containing water molecules may be a water monomer simple substance or a water cluster simple substance and both the simple substances may be mixed. However, when using water cluster ions as the primary ion beam, a beam of nonionic particles containing a water cluster may be acceptable.

In this embodiment, liquid cluster ions, such as water ($H_2O$), or gas cluster ions, such as Ar, are used as the primary ion beam.

Since the beam of nonionic particles containing water molecules is emitted from the beam generating portion 3, it is suitable to use water cluster ions for the primary ion beam. More specifically, the use of water cluster ions for the primary ion beam eliminates the necessity of switching a substance to be supplied to the first introduction portion 11, so that the first introduction portion 11 can be used in common.

First, gas is jetted into the beam generating portion 3 from the introduction portion 11, such as a nozzle, at a pressure of about 0.1 MPa to 1 MPa by the same method as that of the first embodiment.

In the introduction portion 11, a mechanism, such as a nozzle, for jetting water or an aqueous solution for generating the beam of nonionic particles containing water molecules and a mechanism, such as a nozzle, for jetting gas for generating the primary ion beam may be separately provided or the same mechanism may be used in common. However, the use of the same mechanism is suitable because the optical axis of both the beams is the same and the necessity of performing axial alignment for each beam is eliminated.

The jetted gas is formed into a cluster using the cooling effect caused by adiabatic expansion.

Part of the generated cluster passes through the beam forming portion 12 constituted by a skimmer, a plurality of apertures, a plurality of slits, and the like, and then led into the ionization chamber 13. The water cluster is ionized in the ionization chamber 13 to generate water cluster ions. As the ionization method, an electron impact method or the like can be used. When using liquid cluster ions, such as water ($H_2O$), as the primary ion beam, an electrospray method can also be used as the ionization method. In this case, since a high voltage is applied to a nozzle used for cluster generation, it is not necessary to separately provide the ionization chamber.

The generated cluster ions are accelerated toward the sample by the extraction electrode 14 to which an energy of several keV is applied.

The generated cluster ion has a wide size distribution of several to thousands of pieces. When using cluster ions with a large mass, damages to the sample can be reduced and the detection of the sample constituent components having a larger molecular weight can be achieved. Therefore, it is suitable to sort the cluster ion size.

When sorting the cluster size, the cluster size sorting portion 16 is disposed in the beam generating portion 3. In the cluster size sorting portion 16, a mass separator, such as a time-of-flight type, a magnetic field deflection type, a quadrupole type, an ion trap type, or a Fourier transform ion cyclotron resonance type, can be disposed.

For example, when sorting the cluster size using the time-of-flight type mass separator, the cluster ion beam accelerated by the extraction electrode 14 is first subjected to pulse shortening by performing chopping by the first deflecting electrode 15. Next, by giving an appropriate delay time (time-of-flight), and then performing chopping again by the second deflecting electrode 17, clusters of specific size are sorted out. The cluster ions thus sorted out are emitted from the beam generating portion 3, and then the sample 2 to which the water molecules 9 are given can be irradiated with the cluster ions. In order to adjust the beam diameter and the beam orbit, it is suitable to dispose one or more beam converging electrodes in the beam generating portion 3.

The switching of the primary ion beam and the beam of nonionic particles containing water molecules can be performed based on whether or not ionization is performed in the ionization chamber 13.

According to this embodiment, the beam of nonionic particles containing water molecules and the primary ion beam can be introduced into the beam generating portion 3 through the same first introduction portion 11. By using, in common, a mechanism, such as a nozzle, for jetting water or an aqueous solution for generating the beam of nonionic particles containing water molecules and a mechanism, such as a nozzle, for jetting gas for generating the primary ion beam in the introduction portion 11, the optical axis of both the beams is the same and the necessity of performing axial alignment for each beam is eliminated.

Third Embodiment

In a third embodiment according to the invention, ionic particles containing water molecules are used as the particles to be made to adhere to the sample in the second mode.

More specifically, water ionic particles are used in both the first and second modes. The primary ions contain water molecules. The particles are generated by changing the acceleration energy for irradiating the sample with the primary ions in the first mode and with the ionic particles in the second mode by changing the irradiation conditions like the acceleration energy.

There are irradiation conditions of two levels or more. Due to the fact that the acceleration energy of one level is an acceleration energy at which damages to the sample are reduced to a negligible level as compared with damages to the sample caused by irradiation with the primary ions at the highest acceleration energy, the particles can be used as the ionic particles to be made to adhere to the sample in the second mode. The other configurations are the same as those of the first and the second embodiments.

In the invention, the acceleration energy of the primary ions may be fixed or may be changed to two levels or more. In the case of having two levels or more, when irradiation of the primary ions are performed at a high acceleration energy, the sputtering ratio (the number of the secondary particles emitted from the surface per primary ion) increases. Therefore, while the signal intensity in the secondary ion mass spectrometry can be increased, damages to the sample arise. On the other hand, when irradiation of the primary ions are performed at a low acceleration energy, the sputtering ratio decreases. Therefore, while the signal intensity in the secondary ion mass spectrometry decreases, damages to the sample can be suppressed. The depth of the primary ions entering into the sample is shorter when the acceleration energy is lower. Therefore, molecules constituting the primary ions are easily deposited on the sample surface by irradiation with the primary ions at a low acceleration energy.

Therefore, when using, as the acceleration energy for the irradiation with ions in the second mode, the acceleration energy at which damages to the sample can be reduced to a negligible level as compared with damages to the sample caused by the irradiation with the primary ions in the first mode, water molecules can be efficiently given to the sample surface using the ions. Since it is not necessary to measure during the irradiation with the ions by the second mode, it is not necessary to perform the emission of the secondary ions from the sample.

When water molecules are given using the primary ions with a low acceleration energy in addition to giving the water molecules by nonionic particles, the ion control by an electric field is achieved. Therefore, fine adjustment of the amount or the region of the water molecules to be given is facilitated.

The damages referred to in the invention indicate any one of the following states caused by the irradiation with the primary ions: (1) a state in which the sample constituent components are sputtered into a vacuum from the sample surface, (2) a state in which the form of a sample surface changes, and (3) a state in which the composition and the chemical state of molecules of the sample surface change. The negligible damages refer to the fact that the amount of change before and after the irradiation with the primary ions in (1) to (3) above is 1% or lower as compared with the case of irradiation of the primary ions using the highest acceleration energy among the acceleration energies of two levels or more. The amount of change in (1) to (3) above can be evaluated by surface analysis methods using, such as an atomic force microscope, a scanning electron microscope, a transmission electron microscope, an X ray photoelectron spectroscopy, and a secondary ion mass spectrometry, weight measurement, level difference measurement by a stylus type profilometer, and the like.

The acceleration energy of the primary ions used in the invention is not particularly limited. Since the optimal value for obtaining the highest sputtering ratio varies depending on the combination of the primary ion type and the sample molecule type, the acceleration energy may be set according to the combination thereof. However, when an acceleration energy of 1 to 100 keV is used, the sputtering efficiency most improves in many cases. When the acceleration energy is higher than that, the primary ions deeply enter into the sample to markedly destroy the inside of the sample, so that the sputtering ratio decreases in some cases. From the description above, an acceleration energy in the range of 1 to 100 keV is suitably used in the irradiation with the primary ions at the highest acceleration energy among the acceleration energies of two levels or more.

When the acceleration energy is lower than 1 keV, the sputtering ratio markedly decreases in many cases. Therefore, when the acceleration energy is set to 1 keV or lower, the signal intensity in the secondary ion mass spectrometry becomes very small but the sample damages can be made small. The acceleration energy of the primary ions used for giving water molecules in the invention is not particularly limited insofar as damages to the sample are reduced to a negligible level as compared with damages to the sample caused by the irradiation with the primary ions using the highest acceleration energy among the acceleration energies of two levels or more. From the reason described above, the acceleration energy is suitably 100 eV or lower and more suitably 10 eV or lower. Or, the acceleration energy for the irradiation with the primary ions aiming at giving water molecules is smaller by suitably two digits or more and more suitably at least three digits or more than the highest acceleration energy, i.e., the acceleration energy aiming at an increase in the sensitivity of the secondary ion mass spectrometry.

The change in the acceleration energy can be controlled by a potential difference (acceleration voltage) of various types of electrodes from the sample potential. Therefore, when irradiating the sample with primary ions with positive polarity, for example, the irradiation at a low acceleration energy can be achieved by holding the electrode potential at a fixed level and setting the sample potential to be slightly smaller than the electrode potential, so that water molecules can be given while suppressing the sample damages. Next, by setting the sample potential to the ground potential, the irradiation at a high acceleration energy can be achieved, so that secondary ion mass spectrometry can be performed with high sensitivity.

Fourth Embodiment

In a fourth embodiment according to the invention, the irradiation with the beam of nonionic particles containing water molecules and the irradiation with the primary ion beam are performed while alternately switching. The configuration other than the irradiation method is the same as those of the first and second embodiments.

In the invention, it is suitable to emit the beam of nonionic particles containing water molecules in a pulsed manner and it is suitable to use a pulse valve for the introduction portion 11. By emitting the beam in a pulsed manner, the amount of the water molecules to be given can be controlled by the number of pulses (i.e., the number of pulses to be introduced), so that the controllability of the amount of the water molecules to be given to the sample surface can be improved.

Figure 3A:
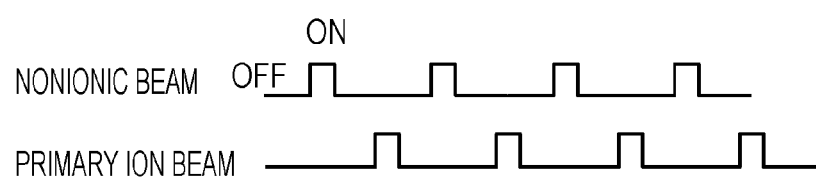
FIGS. 3A to 3C are views describing water molecule giving processes of the invention.
Figure 3B:
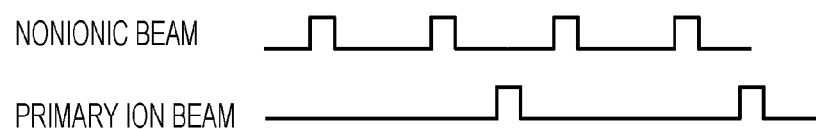
Figure 3C:
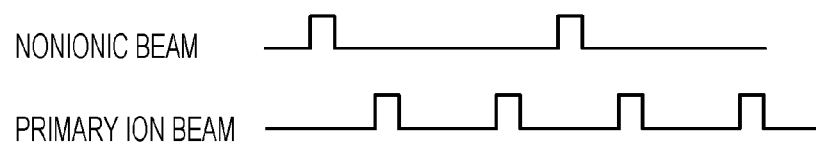

In general, in order to obtain a detection intensity required for the analysis, measurement is repeatedly performed to integrate data in the mass spectrometry. When repeating measurement to integrate data, the irradiation with the beam of nonionic particles containing water molecules and the irradiation with the primary ion beam may be alternately performed. For example, in the irradiation with each beam in a pulsed manner, irradiation of the beam of nonionic particles containing water molecules is performed in one pulse, and then irradiation of the primary ion beam is performed in one pulse as illustrated in FIG. 3A, so that secondary ions are detected. By repeating this process, the signal detection intensity required for the analysis can be obtained. The pulse irradiation with each beam is not required to perform for every one pulse, and may be performed for every multiple pulses. For example, irradiation of the beam of nonionic particles containing water molecules may be performed in two pulses, and then irradiation of the primary ion beam may be performed in one pulse as illustrated in FIG. 3B, so that then secondary ions may be detected. Or, irradiation of the beam of nonionic particles containing water molecules may be performed in one pulse, and then irradiation of the primary ion beam may be performed in two pulses as illustrated in FIG. 3C, so that then secondary ions may be detected.

As illustrated in FIGS. 4A to 4E, in one pulse of a beam 21 of nonionic particles containing water molecules, a part thereof may be ionized to form a primary ion beam 22, and then the sample may be irradiated with both the beams. FIGS. 3A to 3C illustrate the inside of the beam generating portion 3 in a simplified manner. FIGS. 4A to 4E illustrate processes from a process in which a pulse is emitted into the beam generating portion 3 until a process the pulse strikes the sample in chronological order.

Figure 4A:
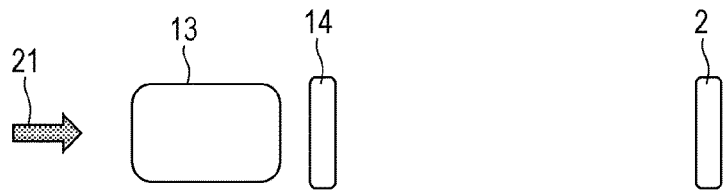
FIGS. 4A to 4E are views describing Examples of the invention.
Figure 4B:
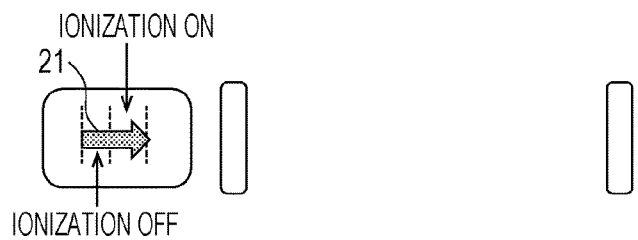
Figure 4C:
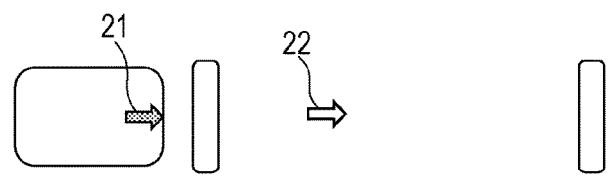
Figure 4D:
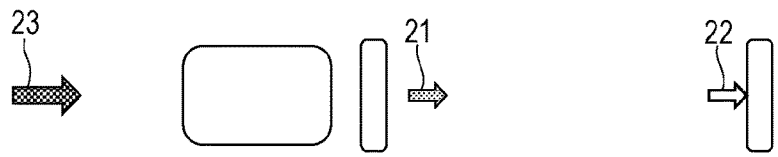
Figure 4E:
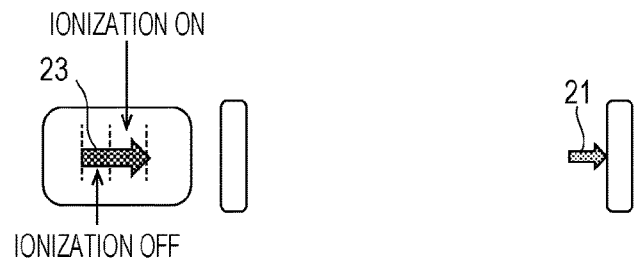

Since the primary ion beam 22 is accelerated by the extraction electrode 14 and the like in the beam generating portion 3 and the sample is irradiated with the primary ion beam 22, the sample is first irradiated with the primary ion beam 22 (FIG. 4D). Thereafter, the sample is irradiated with the beam 21 of nonionic particles in a delayed manner (FIG. 4E). More specifically, the water molecules are given mainly after the irradiation with the beam of nonionic particles in the first cycle. Therefore, it is suitable to determine the pulse interval in such a manner that the sample is irradiated with the first beam pulse 21 of nonionic particles (FIG. 4E), and then the sample is irradiated with a partially ionized primary ion beam pulse 23 of nonionic particles. In this case, for the simplification of the apparatus configuration, it is suitable that the beam of nonionic particles containing water molecules is a water cluster beam (including a water monomer) and the primary ion beam in which the beam of nonionic particles is partially ionized is a water cluster ion beam.

These methods are effective for increasing the detection sensitivity to the secondary ions when the water molecules on the sample surface are removed by the irradiation with the primary ion beams.

When the beam of nonionic particles containing water molecules is emitted in a pulsed manner, as a method for controlling the amount of the water molecules 9 to be given to the surface of the sample 2, the optimal water molecule giving conditions can also be obtained by creating a correlation table of the number of irradiation pulses of the beam of nonionic particles containing water molecules and the amount of water molecules to be given to the sample.

The amount of the water molecules to be given to the sample can be calculated by the method described above.

Moreover, the optimal water molecule giving conditions can also be obtained by creating a correlation table of the number of irradiation pulses of the beam of nonionic particles containing water molecules and the ion signal intensity of the sample constituent components.

According to this embodiment, by emitting the beam of nonionic particles containing water molecules in a pulsed manner, the amount of water molecules to be given can be controlled by the number of irradiation pulses, so that the controllability of the amount of the water molecules to be given to the sample surface can be improved.

Fifth Embodiment

In a fifth embodiment according to the invention, the timing of giving or removing the water molecules is controlled in response to the signal intensity of water molecule-derived ions in such a manner that the signal intensity of the water molecule-derived ions obtained by one irradiation with the primary ions is fixed. Except the timing control method, the configuration is the same as those of the first to fourth embodiments.

When repeating the process of giving water molecules, and then performing irradiation of the primary ions to perform secondary ion mass spectrometry, the giving of the water molecules and sputtering with the irradiation with the primary ions occur. Therefore, the amount of water molecules remaining on the surface immediately before the irradiation with the primary ions varies. When the amount of the water molecules present on the sample surface varies in each irradiation with the primary ions, the ionization efficiency of each molecule type constituting the sample changes in each irradiation with the primary ions. As a result, when repeatedly performing secondary ion mass spectrometry for the same sample region to integrate data, the relative intensity between the peaks varies in each piece of data, so that the quantitativity is impaired. Therefore, when repeatedly performing secondary ion mass spectrometry for the same sample region to integrate data, it is suitable that the amount of the water molecules present is suitably fixed in each irradiation with the primary ions. In addition, also when quantitatively comparing between different regions or between different samples, it is suitable that the amount of the water molecules present is the same in both the cases. In this embodiment, the amount of the water molecules present can be evaluated based on the ion signal derived from water molecules. Therefore, the quantitativity can be increased when the timing of giving or removing the water molecules is controlled in response to the signal intensity of the water molecule-derived ions in such a manner that the signal intensity of the water molecule-derived ions obtained by one irradiation with the primary ions is fixed.

The signal intensity of the water molecule-derived ions slightly changes due to a measurement error even when the remaining amount of the water molecules is the same. The change in the remaining amount of the water molecules can be permitted insofar as the quantitativity is not affected. Therefore, the fact that the signal intensity of the water molecule-derived ions is fixed in the invention refers to the fact that the change in the signal intensity of the water molecule-derived ions obtained in each irradiation with the primary ions is within ±20%.

Figure 2A:
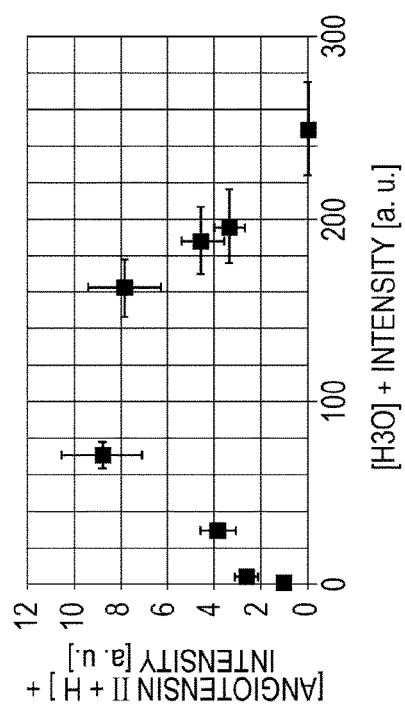
FIGS. 2A and 2B illustrate a signal intensity correlation table of the peak area intensity of [Angiotensin II+H]$^+$ and the peak area intensity of water molecule-derived ions [H$_3$O]$^+$ and the relationship with the given amount of water molecules measured using a crystal oscillator sensor, respectively.
Figure 2B:
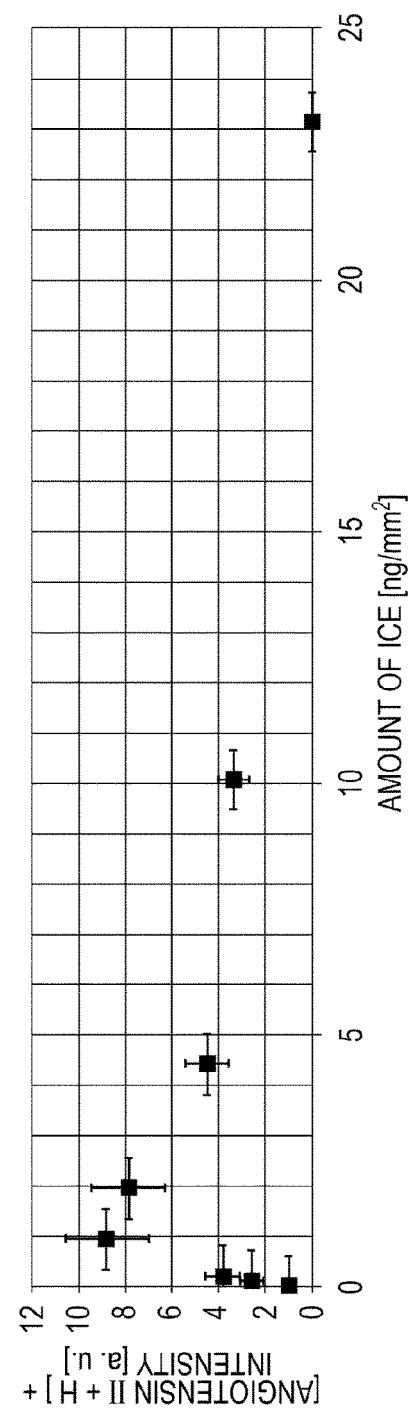

A signal intensity correlation table of the signal intensity of the water molecule-derived ions and the signal intensity of the sample constituent component ions is created in the same manner as in the example of FIG. 2A, and then may be utilized. More specifically, data excellent in quantitativity can be obtained with good sensitivity by determining the signal intensity of the water-derived secondary ions at which the intensity of the secondary ions of the target sample molecules becomes the maximum, and controlling the timing in such a manner that the intensity is fixed.

Other Embodiments

The invention also provides a mass image analyzing system having the mass spectrometer described above.

The mass image analyzing system of this embodiment has the mass spectrometer described in the first to third embodiments above, an image data obtaining unit, e.g., a computer for obtaining mass image data based on the mass spectrometry data obtained by the apparatus, and a display unit for displaying the obtained mass image data as an image, e.g., a display. The mass image analyzing system of this embodiment may be constituted as a system in which the units are integrated or may be constituted as a remote system through the Internet or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-156631, filed Jul. 12, 2012, which is hereby incorporated by reference herein in its entirety.

The invention claimed is:

1. A mass spectrometer which irradiates a sample with primary ions to perform mass spectrometry of secondary ions emitted from the sample, the mass spectrometer comprising:
   a chamber in which the sample is disposed;
   an irradiation unit for irradiating the sample with particles; and
   an extraction electrode which leads the secondary ions emitted from the sample to a mass spectrometry unit,
   the irradiation unit switching between a first mode of irradiation of the primary ions for causing the secondary ions to be emitted from the sample and a second mode of emitting nonionic particles containing water molecules to be made to adhere to the sample, and irradiating the sample with the particles, and
   the irradiation unit having an opening for connection to inside of the chamber, and the sample being irradiated with the primary ions and the nonionic particles containing the water molecules through the opening.

2. The mass spectrometer according to claim 1, wherein the particles containing water molecules are nonionic particles.

3. The mass spectrometer according to claim 2, wherein the irradiation unit is a beam irradiation unit for irradiating the sample with a primary ion beam of the primary ions and a beam of the nonionic particles.

4. The mass spectrometer according to claim 1, wherein the irradiation unit is a beam irradiation unit for irradiation of a primary ion beam of the primary ions and a beam of ionic particles containing water molecules, and an acceleration energy for the irradiation with the particles in the second mode is lower than an acceleration energy for the irradiation with the primary ions in the first mode.

5. The mass spectrometer according to claim 1, further comprising a cooling portion for cooling the sample in the chamber.

6. The mass spectrometer according to claim 1, wherein a water molecule film is formed on a surface of the sample by giving water molecules to a surface of the sample.

7. The mass spectrometer according to claim 1, wherein the primary ions contain water molecules and, as an introduction portion for introducing raw materials containing water molecules to the irradiation unit, an introduction portion for generating the primary ions and an introduction portion for generating particles containing water molecules to cause water to adhere to the sample are the same or several different introduction portions.

8. The mass spectrometer according to claim 1, wherein the primary ions are water cluster ions and the particles containing water molecules are particles containing a water cluster.

9. The mass spectrometer according to claim 4, wherein the irradiation unit changes an acceleration energy for the irradiation with ions and an acceleration energy of the particles in the second mode is an acceleration energy which suppresses damages to the sample to negligible damages as compared with damages caused by the irradiation with the primary ions in the first mode.

10. The mass spectrometer according to claim 3, wherein the irradiation unit has a pulse valve for pulsing the primary ion beam or the beam of the particles and for irradiation of the beam.

11. The mass spectrometer according to claim 3, wherein the sample is alternately irradiated with the beam of the particle in the second mode and the primary ion beam in the first mode.

12. The mass spectrometer according to claim 8, wherein the beam of the water cluster ions is a beam formed by ionizing a part of the water cluster which is pulsed.

13. The mass spectrometer according to claim 12, wherein timing of giving or removing water molecules is controlled in response to a signal intensity of water molecule-derived ions in such a manner that the signal intensity of the water molecule-derived ions obtained by one irradiation with the beam is fixed.

14. The mass spectrometer according to claim 3, wherein an irradiation diameter of the beam of the particles with which the sample is irradiated is equal to or larger than an irradiation diameter of the primary ion beam.

15. The mass spectrometer according to claim 1, wherein the sample is irradiated with the particles in such a manner that the amount of water molecules to be given to the surface of the sample is 0.1 ng/mm$^2$ or more and 20 ng/mm$^2$ or lower.

16. The mass spectrometer according to claim 1, wherein the amount of water molecules to be given to the surface of the sample is controlled using any one of the following methods (1) to (6):
   (1) a method using a reflectance change of infrared light or visible light,
   (2) a method using a crystal oscillator sensor,
   (3) a method using the number of introduced water molecules or the number of water molecules with which a sample is irradiated,
   (4) a method using the number of pulses to be introduced of a beam of nonionic particles containing water molecules,
   (5) a method using a signal intensity correlation table in mass spectrometry of water molecule-derived ions and sample constituent component ions, and
   (6) a method using a signal intensity correlation table in mass spectrometry of the number of pulses to be introduced of a beam of nonionic particles containing water molecules and sample constituent component ions.

17. A mass image analyzing system comprising the mass spectrometer according to claim 1,
   the mass image analyzing system, comprising:
   an image data obtaining unit for obtaining mass image data based on mass spectrometry data obtained by the mass spectrometer; and
   a display unit for displaying the obtained mass image data as an image.

18. The mass spectrometer according to claim 1, wherein the irradiation unit having a protruding portion in the inside of the chamber, the opening arranged at the top of the protruding portion.

19. The mass spectrometer according to claim 1, wherein the irradiation unit consists of a single irradiation unit.

* * * * *